(12) United States Patent
Woo et al.

(10) Patent No.: US 11,004,393 B2
(45) Date of Patent: May 11, 2021

(54) DISPLAY DEVICE

(71) Applicant: Samsung Display Co., Ltd., Yongin-si (KR)

(72) Inventors: Minkyu Woo, Yongin-si (KR); Minku Lee, Yongin-si (KR); Junwon Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/877,299

(22) Filed: May 18, 2020

(65) Prior Publication Data

US 2020/0279530 A1    Sep. 3, 2020

Related U.S. Application Data

(63) Continuation of application No. 16/136,974, filed on Sep. 20, 2018, now Pat. No. 10,657,892.

(30) Foreign Application Priority Data

Sep. 21, 2017   (KR) ........................ 10-2017-0121870

(51) Int. Cl.
| | | |
|---|---|---|
| G09G 3/3233 | (2016.01) | |
| H01L 27/32 | (2006.01) | |
| G09G 3/3266 | (2016.01) | |
| H01L 51/56 | (2006.01) | |
| G09G 3/3275 | (2016.01) | |
| H01L 51/52 | (2006.01) | |

(52) U.S. Cl.
CPC ......... *G09G 3/3233* (2013.01); *G09G 3/3266* (2013.01); *G09G 3/3275* (2013.01);
(Continued)

(58) Field of Classification Search
CPC .. G09G 3/3233; G09G 3/3266; G09G 3/3275; H01L 51/56; H01L 51/5203; H01L 27/3262

See application file for complete search history.

(56) References Cited

U.S. PATENT DOCUMENTS 5,289,021 A * 2/1994 El Gamal ......... H01L 27/11807
257/206
9,041,000 B2 5/2015 Jeon
(Continued)

FOREIGN PATENT DOCUMENTS

| JP | 2008-287139 A | 11/2008 |
|---|---|---|
| JP | 2009-169071 A | 7/2009 |

(Continued)

*Primary Examiner* — Peniel M Gumedzoe
(74) *Attorney, Agent, or Firm* — Lewis Roca Rothgerber Christie LLP

(57) ABSTRACT

A display device includes: a first driving transistor including a first gate electrode and a first semiconductor layer including a first source region and a first drain region, the first driving transistor being in a first pixel area of a substrate; a second driving transistor including a second gate electrode and a second semiconductor layer including a second source region and a second drain region, the second driving transistor being in a second pixel area adjacent the first pixel area of the substrate; a first electrode layer overlapping at least a portion of the first source region of the first driving transistor; a second electrode layer overlapping at least a portion of the second source region of the second driving transistor; a first power line electrically connected to the first electrode layer; and a second power line electrically connected to the second electrode layer.

18 Claims, 12 Drawing Sheets

(52) U.S. Cl.
CPC ...... *H01L 27/3216* (2013.01); *H01L 27/3218* (2013.01); *H01L 27/3262* (2013.01); *H01L 51/56* (2013.01); *G09G 2300/0452* (2013.01); *G09G 2300/0852* (2013.01); *G09G 2300/0861* (2013.01); *G09G 2310/0262* (2013.01); *G09G 2310/0278* (2013.01); *G09G 2320/0233* (2013.01); *G09G 2320/045* (2013.01); *H01L 51/5203* (2013.01)

(56) References Cited

U.S. PATENT DOCUMENTS

| | | | |
|---|---|---|---|
| 2006/0007077 A1* | 1/2006 | Joo | G09G 3/3208 345/77 |
| 2011/0199808 A1* | 8/2011 | Yi | G11C 11/4091 365/72 |
| 2013/0147692 A1 | 6/2013 | Yamashita et al. | |
| 2013/0321248 A1* | 12/2013 | Kimura | H01L 33/0041 345/76 |
| 2014/0264355 A1 | 9/2014 | Yamashita et al. | |
| 2016/0379569 A1 | 12/2016 | Lee et al. | |
| 2017/0194390 A1 | 7/2017 | Kim | |
| 2017/0352312 A1* | 12/2017 | Ebisuno | G09G 3/3233 |
| 2019/0253659 A1* | 8/2019 | Kobayashi | H01L 27/14612 |

FOREIGN PATENT DOCUMENTS

| | | |
|---|---|---|
| KR | 10-2015-0010523 A | 1/2015 |
| KR | 10-2015-0116070 A | 10/2015 |

* cited by examiner

DISPLAY DEVICE

CROSS-REFERENCE TO RELATED APPLICATIONS

This application is a continuation of U.S. patent application Ser. No. 16/136,974, filed Sep. 20, 2018, which claims priority to and the benefit of Korean Patent Application No. 10-2017-0121870, filed Sep. 21, 2017, the entire content of both of which is incorporated herein by reference.

BACKGROUND

1. Field

Aspects of one or more example embodiments relate to a display device.

2. Description of the Related Art

A display device such as an organic light-emitting display device and a liquid crystal display device includes an array substrate including a thin film transistor (TFT), a capacitor, and a plurality of wirings. The array substrate includes fine patterns such as TFTs, capacitors, and wirings, and the display device operates by complicated connections between the TFTs, the capacitors, and the wirings.

Recently, as a demand for compact and high resolution display devices increases, a demand for efficient space arrangement between TFTs, capacitors, and wirings included in the display device, a connection structure, a driving method, and quality improvement of an implemented image increases.

The above information disclosed in this Background section is only for enhancement of understanding of the background and therefore it may contain information that does not constitute prior art.

SUMMARY

Aspects of one or more example embodiments include a display device which may prevent a color spreading phenomenon.

Additional aspects will be set forth in part in the description which follows and, in part, will be apparent from the description, or may be learned by practice of the presented embodiments.

According to one or more example embodiments of the present invention, a display device includes: a first driving transistor including a first gate electrode and a first semiconductor layer, the first semiconductor layer including a first source region and a first drain region, the first driving transistor being in a first pixel area of a substrate; a second driving transistor including a second gate electrode and a second semiconductor layer including a second source region and a second drain region, the second driving transistor being in a second pixel area adjacent the first pixel area of the substrate; a first electrode layer overlapping, in plan view, at least a portion of the first source region of the first driving transistor; a second electrode layer overlapping, in plan view, at least a portion of the second source region of the second driving transistor; a first power line electrically connected to the first electrode layer; and a second power line electrically connected to the second electrode layer.

A second overlapping area of the second source region of the second driving transistor and the second electrode layer may be greater than a first overlapping area of the first source region of the first driving transistor and the first electrode layer.

An area of the second source region may be greater than an area of the first source region.

An area of the second electrode layer may be greater than an area of the first electrode layer.

The first electrode layer may overlap the first gate electrode in plan view, and the second electrode layer may overlap the second gate electrode in plan view.

The first electrode layer may be in an upper layer of the first source region, and the second electrode layer may be in an upper layer of the second source region.

The first electrode layer may be in a lower layer of the first source region, and the second electrode layer may be in a lower layer of the second source region.

The display device may further include: a third driving transistor including a third gate electrode and a third semiconductor layer including a third source region and a third drain region, the third driving transistor being in a third pixel area adjacent the second pixel area of the substrate; a third electrode layer overlapping, in plan view, at least a portion of the third source region of the third driving transistor; and a third power line electrically connected to the third electrode layer.

A third overlapping area of the third source region of the third driving transistor and the third electrode layer may be same as one of the first overlapping area or the second overlapping area.

A third overlapping area of the third source region of the third driving transistor and the third electrode layer may be different from the first overlapping area and the second overlapping area.

The display device may further include: a third electrode layer below the first source region of the first driving transistor, the third electrode layer overlapping, in plan view, at least a portion of the first source region; and a fourth electrode layer below the second source region of the second driving transistor, the fourth electrode layer overlapping, in plan view, at least a portion of the second source region.

The display device may further include: at least one first thin film transistor connected to the first driving transistor, the at least one first thin film transistor being in the first pixel area; at least one second thin film transistor connected to the second driving transistor, the at least one second thin film transistor being in the second pixel area; a first pixel electrode electrically connected to the first driving transistor; a second pixel electrode electrically connected to the second driving transistor; and a light-shielding member on the first thin film transistor and shielding external light.

At least a portion of the first pixel electrode may overlap, in plan view, at least one of a source region or a drain region of the first thin film transistor, and at least a portion of the light-shielding member may overlap, in plan view, at least one of a source region or a drain region of the second thin film transistor.

According to one or more embodiments, a display device includes: a substrate including a first pixel area and a second pixel area adjacent the first pixel area; and a first pixel circuit and a second pixel circuit respectively in the first pixel area and the second pixel area of the substrate, wherein each of the first pixel circuit and the second pixel circuit includes: a semiconductor layer including a source region, a channel region, and a drain region; a gate electrode corresponding to the channel region over the semiconductor layer; and an electrode layer over the gate electrode and facing the gate electrode, the electrode layer being electrically connected to a power line.

At least a portion of the electrode layer may at least face the source region, and a facing area of the electrode layer and the source region of the second pixel circuit may be greater than a facing area of the electrode layer and the source region of the first pixel circuit.

A width of the source region of the second pixel circuit may be greater than a width of the source region of the first pixel circuit.

A length of the electrode layer of the second pixel circuit in a first direction may be greater than a length of the electrode layer of the first pixel circuit in the first direction, the first direction being a width direction of the source region.

The display device may further include: a third pixel area adjacent the second pixel area of the substrate, wherein a third pixel circuit is in the third pixel area.

A facing area of an electrode layer and a source region of the third pixel circuit may be same as one of the facing area of the electrode layer and the source region of the first pixel circuit, and the facing area of the electrode layer and the source region of the second pixel circuit.

A facing area of an electrode layer and a source region of the third pixel circuit may be different from the facing area of the electrode layer and the source region of the first pixel circuit, and the facing area of the electrode layer and the source region of the second pixel circuit.

The display device may further include a second electrode layer below the source region and facing at least a portion of the source region.

According to one or more embodiments, a display device includes: a substrate including a first pixel area and a second pixel area adjacent the first pixel area; a first pixel circuit including a first driving transistor including a first semiconductor layer and a first gate electrode, and a first capacitor including a first lower electrode and a first upper electrode, the first semiconductor layer including a first source region and a first drain region, the first pixel circuit being in the first pixel area of the substrate; a second pixel circuit including a second driving transistor including a second semiconductor layer and a second gate electrode, and a second capacitor including a second lower electrode and a second upper electrode, the second semiconductor layer including a second source region and a second drain region, the second pixel circuit being in the second pixel area of the substrate; a first power line electrically connected to the first upper electrode; and a second power line electrically connected to the second upper electrode.

The first lower electrode may be at least a portion of the first source region, the second lower electrode may be at least a portion of the second source region, and a facing area of the second lower electrode and the second upper electrode of the second capacitor may be greater than a facing area of the first lower electrode and the first upper electrode of the first capacitor.

A width of the second lower electrode may be greater than a width of the first lower electrode.

A length of the second upper electrode in a width direction of the second source region may be greater than a length of the first upper electrode in a width direction of the first source region.

The display device may further include: a third capacitor including an extension portion of the first upper electrode of the first capacitor and the first gate electrode of the first driving transistor, the third capacitor being in the first pixel area; and a fourth capacitor including an extension portion of the second upper electrode of the second capacitor and the second gate electrode of the second driving transistor, the fourth capacitor being in the second pixel area.

A display device according to an embodiment may provide a high quality image by preventing a color spreading phenomenon.

BRIEF DESCRIPTION OF THE DRAWINGS

These and/or other aspects will become more apparent and more readily appreciated from the following description of the embodiments, taken in conjunction with the accompanying drawings in which.

DETAILED DESCRIPTION

Figure 1:
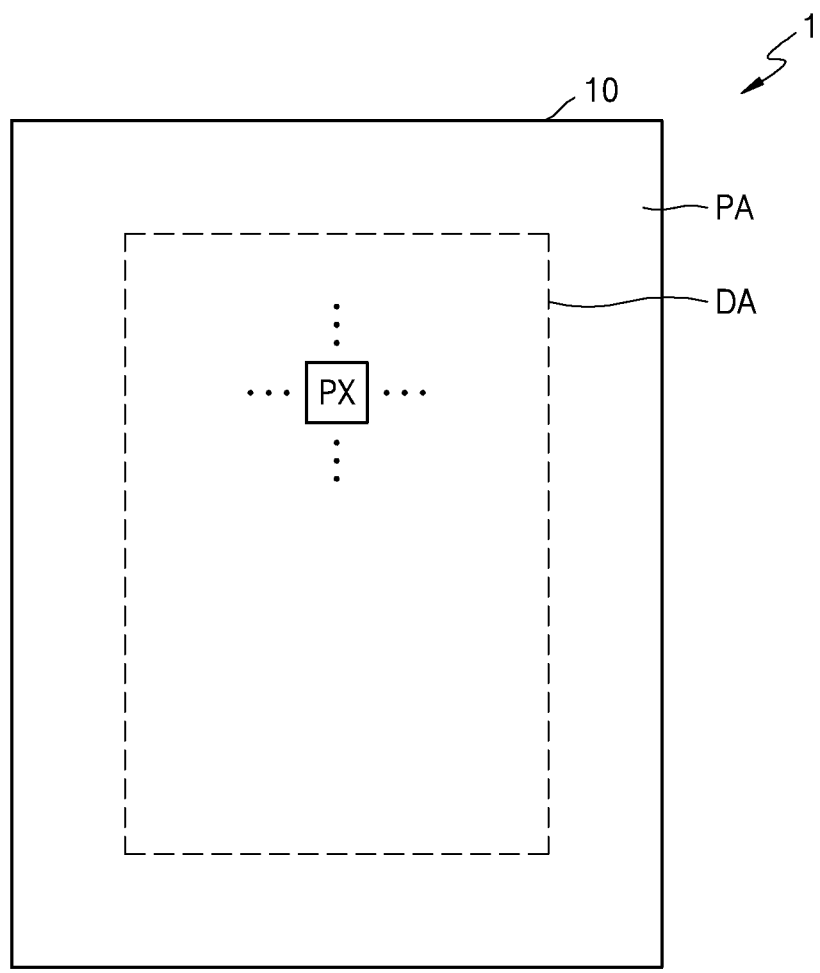
FIG. 1 is a plan view of a display device according to some example embodiments.

As the disclosure allows for various changes and numerous embodiments, example embodiments will be illustrated in the drawings and described in more detail in the written description. An effect and a characteristic of the disclosure, and a method of accomplishing these will be apparent when referring to embodiments described with reference to the drawings. This disclosure may, however, be embodied in many different forms and should not be construed as limited to the example embodiments set forth herein.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

Sizes of elements in the drawings may be exaggerated for convenience of explanation. In other words, because sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

Hereinafter, the disclosure will be described more fully with reference to the accompanying drawings, in which example embodiments of the disclosure are shown. When description is made with reference to the drawings, like reference numerals in the drawings denote like or corresponding elements, and some repetitive description thereof will be omitted.

FIG. 1 is a plan view of a display device 1 according to an embodiment.

Referring to FIG. 1, the display device 1 includes a substrate 10. The substrate 10 includes a display area DA and a peripheral area PA outside the display area DA (e.g., outside a footprint of the display area DA).

A plurality of pixels PX may be arranged in the display area DA of the substrate 10. Various wirings transferring an electric signal to be applied to the display area DA may be arranged in the peripheral area PA of the substrate 10.

The pixels PX may include a first pixel emitting light of a first color, a second pixel emitting light of a second color, and a third pixel emitting light of a third color. The first pixel may be a red pixel, the second pixel may be a green pixel, and the third pixel may be a blue pixel. An embodiment is not limited thereto and may include one or more pixels PX emitting light of different colors.

Figure 2:
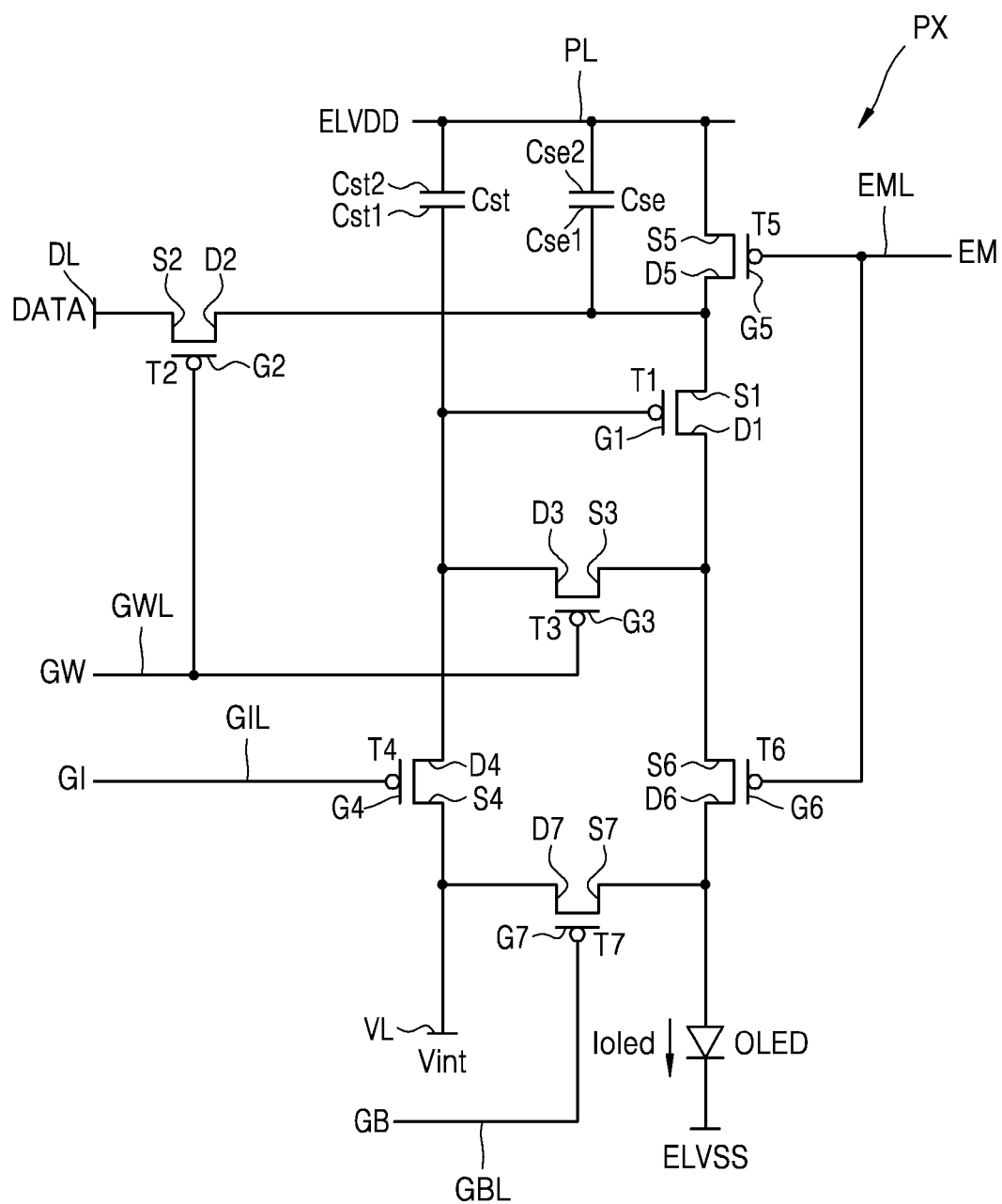
FIG. 2 is an equivalent circuit diagram of one pixel of the display device of FIG. 1 according to some example embodiments.

FIG. 2 is an example equivalent circuit diagram of one pixel of the display device 1 of FIG. 1 (there may be more) according to an embodiment.

A pixel PX includes a light-emitting element which emits light, and a pixel circuit receiving signals from a plurality of wirings and driving the light-emitting element. Hereinafter, a pixel PX including an organic light-emitting device (OLED) as a light-emitting element is described as an example.

The wirings may include a first scan line GIL transferring a first scan signal GI, a second scan line GWL transferring a second scan signal GW, a third scan line GBL transferring a third scan signal GB, a data line DL transferring a data signal DATA, and a power line PL transferring a first power voltage ELVDD. However, example embodiments are not limited thereto and the wirings may further include an initialization line VL transferring an initialization voltage Vint and an emission control line EML transferring an emission control signal EM, as illustrated in FIG. 2.

A pixel circuit of a pixel PX may include a plurality of transistors T1 to T7 and capacitors Cst and Cse.

The first transistor T1 includes a gate electrode G1 connected to a first electrode Cst1 of the first capacitor Cst, a first electrode S1 connected to the power line PL via the fifth transistor T5, and a second electrode D1 electrically connected to a pixel electrode of an OLED via the sixth transistor T6. The first transistor T1 serves as a driving transistor, and receives a data signal DATA depending on a switching operation of the second transistor T2 and supplies a current to the OLED.

The second transistor T2 includes a gate electrode G2 connected to the second scan line GWL, a first electrode S2 connected to the data line DL, and a second electrode D2 connected to the first electrode S1 of the first transistor T1. The second transistor T2 is turned on in response to a second scan signal GW transferred through the second scan line GWL and performs a switching operation of transferring a data signal DATA transferred through the data line DL to the first electrode S1 of the first transistor T1.

A third transistor T3 includes a gate electrode G3 connected to the second scan line GWL, a first electrode S3 connected to the second electrode D1 of the first transistor T1, and a second electrode D3 connected to the first electrode Cst1 of the first capacitor Cst, a second electrode D4 of a fourth transistor T4, and the gate electrode G1 of the first transistor T1. The third transistor T3 is turned on in response to a second scan signal GW transferred through the second scan line GWL, and diode-connects the first transistor T1.

The fourth transistor T4 includes a gate electrode G4 connected to the first scan line GIL, a first electrode S4 connected to the initialization line VL, and the second electrode D4 connected to the first electrode Cst1 of the first capacitor Cst, the second electrode D3 of the third transistor T3, and the gate electrode G1 of the first transistor T1. The fourth transistor T4 is turned on in response to a first scan signal GI transferred through the first scan line GIL and performs an initialization operation of initializing a gate voltage of the first transistor T1 by transferring the initialization voltage Vint to the gate electrode G1 of the first transistor T1.

The fifth transistor T5 includes a gate electrode G5 connected to the emission control line EML, a first electrode S5 connected to the power line PL, and a second electrode D5 connected to the second electrode D2 of the second transistor T2.

The sixth transistor T6 includes a gate electrode G6 connected to the emission control line EML, a first electrode S6 connected to the second electrode D1 of the first transistor T1 and the first electrode S3 of the third transistor T3, and a second electrode D6 connected to the pixel electrode of the OLED.

The fifth transistor T5 and the sixth transistor T6 are simultaneously turned on in response to an emission control signal EM transferred through the emission control line EML, and a current flows through the OLED.

The seventh transistor T7 includes a gate electrode G7 connected to the third scan line GBL, a first electrode S7 connected to the second electrode D6 of the sixth transistor T6 and the pixel electrode of the OLED, and a second electrode D7 connected to the initialization line VL. The seventh transistor T7 is turned on in response to a third scan signal GB transferred through the third scan line GBL and performs an initialization operation of initializing a voltage of the pixel electrode of the OLED by transferring the initialization voltage Vint to the pixel electrode of the OLED.

The third scan line GBL connected to the gate electrode G7 of the seventh transistor T7 may be a first scan line GIL or a second scan line GWL of the next row or the previous row, and the third scan signal GB may be a first scan signal GI or a second scan signal GW of the next row or the previous row. The seventh transistor T7 may be omitted.

The first capacitor Cst includes the first electrode Cst1 connected to the gate electrode G1 of the first transistor T1, and a second electrode Cst2 connected to the power line PL. The first electrode Cst1 of the first capacitor Cst is also connected to the second electrode D3 of the third transistor T3 and the second electrode D4 of the fourth transistor T4.

The second capacitor Cse includes a first electrode Cse1 connected to the first electrode S1 of the first transistor T1, and a second electrode Cse2 connected to the power line PL. The first electrode Cse1 of the second capacitor Cse is also connected to the second electrode D2 of the second transistor T2 and the second electrode D5 of the fifth transistor T5.

The OLED includes the pixel electrode and a common electrode facing the pixel electrode, and the common electrode may receive a second power voltage ELVSS.

The OLED includes an intermediate layer between the pixel electrode and the common electrode. The intermediate layer includes an organic emission layer emitting light and may further include at least one of a hole injection layer (HIL), a hole transport layer (HTL), an electron transport layer (ETL), or an electron injection layer (EIL). However, the present embodiment is not limited thereto and various functional layers may be arranged between the pixel electrode and the common electrode.

The organic emission layer may emit red light, green light, or blue light. However, the present embodiment is not limited thereto and the organic emission layer may emit white light. In this case, the organic emission layer may include a structure in which an emission material emitting red light, an emission material emitting green light, and an emission material emitting blue light are stacked, or include a structure in which an emission material emitting red light, an emission material emitting green light, and an emission material emitting blue light are mixed.

The OLED may display an image by receiving a driving current holed from the first transistor T1 and emitting light of a preset color.

Figure 3:
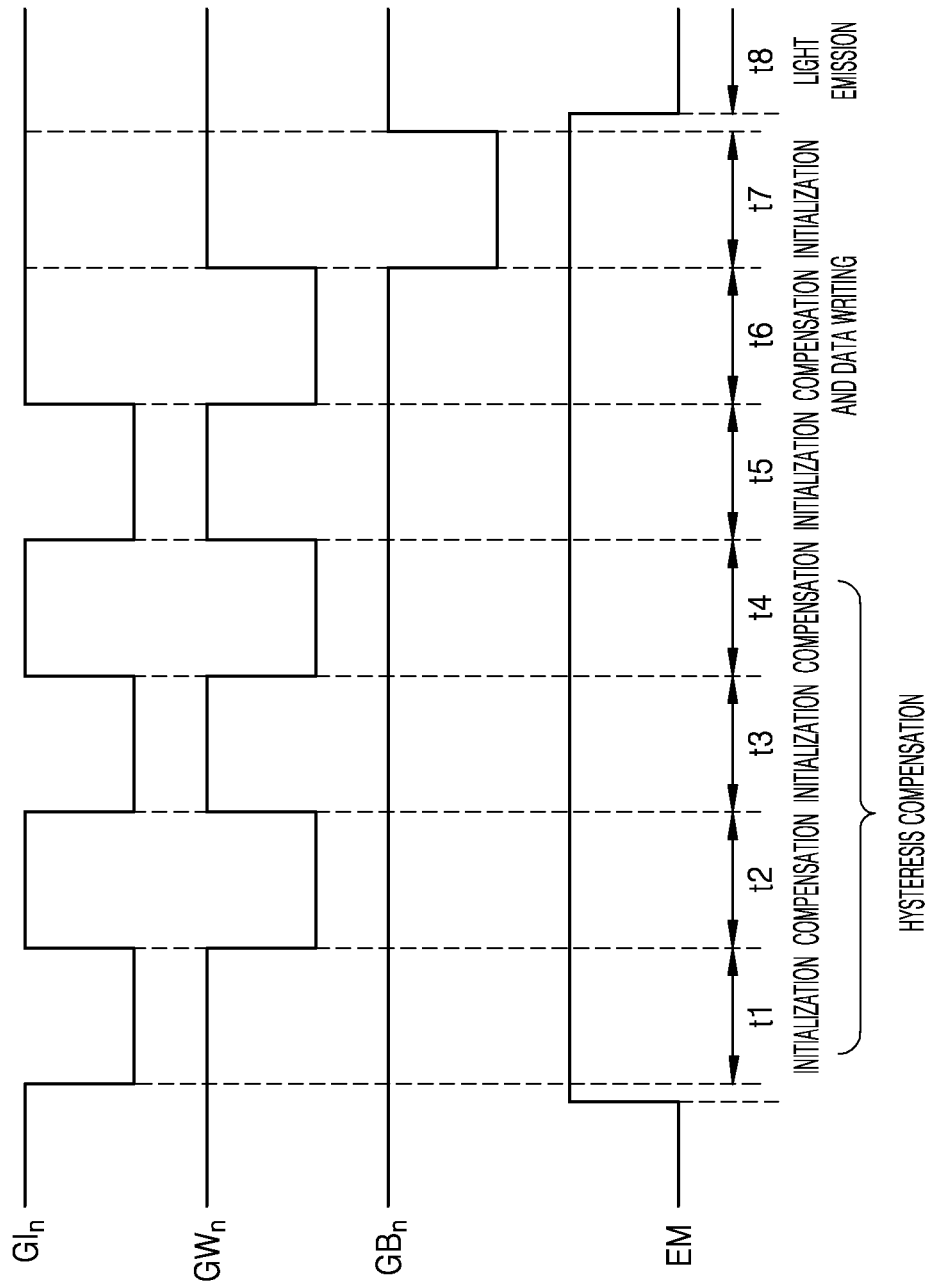
FIG. 3 is a timing diagram illustrating driving of a pixel of FIG. 2 according to some example embodiments.

FIG. 3 is a timing diagram illustrating driving of a pixel of FIG. 2 according to an embodiment.

Referring to FIG. 3, a pixel PX of the embodiment performs operations of hysteresis compensation during time periods t1 to t4, initialization during time period t5, threshold voltage compensation and data writing during time period t6, and light emission during time period t8 during one frame. Initialization of a light-emitting element may be further performed during time period t7 before the light emission during time period t8.

During a period of the hysteresis compensation during time periods t1 to t4, the pixel PX repeatedly performs initialization and threshold voltage compensation.

At the first period t1 and the third period t3, a first scan signal GI is supplied to the first scan line GIL, and thus the initialization voltage Vint is supplied to the gate electrode G1 of the first transistor T1 through the turned-on fourth transistor T4.

Also, at the second period t2 and the fourth period t4, a second scan signal GW is supplied to the second scan line GWL, and thus the first transistor T1 is diode-connected by the turned-on third transistor T3 and a threshold voltage of the first transistor T1 is compensated for.

During the first period t1 to the fourth period t4, before a data signal DATA is applied to the pixel PX, an on-bias voltage is applied to the gate electrode G1 of the first transistor T1 and hysteresis compensation of the first transistor T1 is performed.

Next, at the fifth period t5, a first scan signal GI is supplied through the first scan line GIL, and thus the initialization voltage Vint is supplied to the gate electrode G1 of the first transistor T1 through the turned-on fourth transistor T4. In this case, the second capacitor Cse prevents a voltage drop of the first electrode S1 of the first transistor T1.

Subsequently, at the sixth period t6, a second scan signal GW is supplied to the second scan line GWL, and the second transistor T2 and the third transistor T3 are turned on. When the third transistor T3 is turned on, the first transistor T1 is diode-connected. When the first transistor T1 is diode-connected, a data signal DATA and a compensation voltage corresponding to a threshold voltage of the first transistor T1 are applied to the gate electrode G1 of the first transistor T1. In this case, charge corresponding to a difference between the first power voltage ELVDD and the compensation voltage is stored in the first capacitor Cst.

At the period t7, a third scan signal GB is supplied to the third scan line GBL, and the seventh transistor T7 is turned on. The initialization voltage Vint is supplied to the pixel electrode of the OLED through the seventh transistor T7.

At the eighth period t8, the fifth transistor T5 and the sixth transistor T6 are turned on by an emission control signal EM supplied through the emission control line EML. Therefore, a driving current $I_{oled}$ corresponding to a voltage difference between a voltage of the gate electrode G1 of the first transistor T1 and the first power voltage ELVDD occurs at the first transistor T1, and the driving current $I_{oled}$ is supplied to the OLED through the sixth transistor T6.

Figure 4:
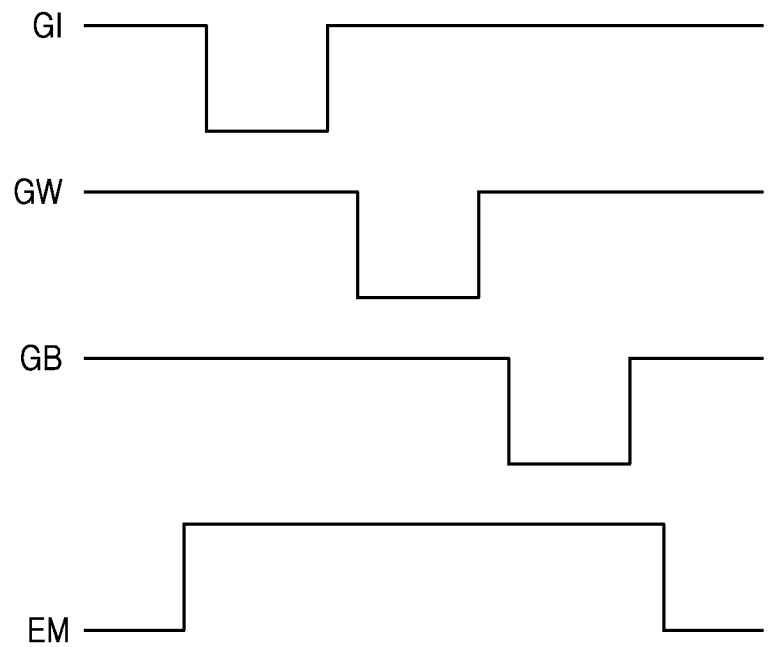
FIG. 4 is a timing diagram illustrating driving of a pixel of FIG. 2 according to some example embodiments.
Figure 5:
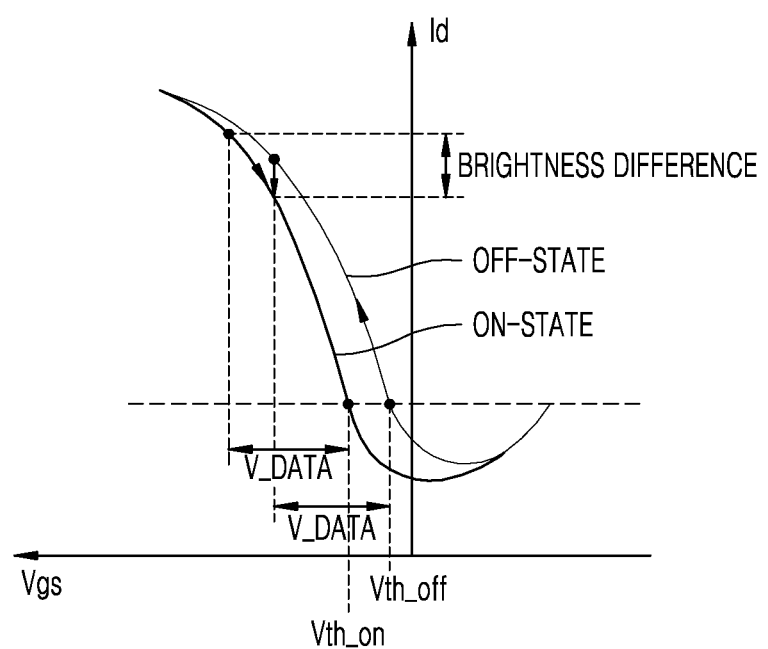
FIG. 5 is a graph of a hysteresis characteristic of a thin film transistor.

FIG. 4 is a timing diagram illustrating driving of a pixel of FIG. 2 according to a comparative example. FIG. 5 is a graph of a hysteresis characteristic of a thin film transistor, and FIG. 6 is a graph illustrating a brightness problem of a display device due to a hysteresis characteristic of a thin film transistor.

When a display device displays an image, a color spreading phenomenon of a preset color occurs. A color spreading phenomenon is caused by a difference between emission time of pixels PX (referred to as 'color pixels') emitting light of different colors, and a hysteresis characteristic of a thin film transistor.

Pixel driving according to the comparative example of FIG. 4 performs operations of initialization t5 of the first transistor T1, threshold voltage compensation and data writing t6, initialization t7 of a light-emitting element, and light emission t8 without the hysteresis compensation period ranging from t1 to t4 of pixel driving according to an embodiment of FIG. 3.

Figure 6:
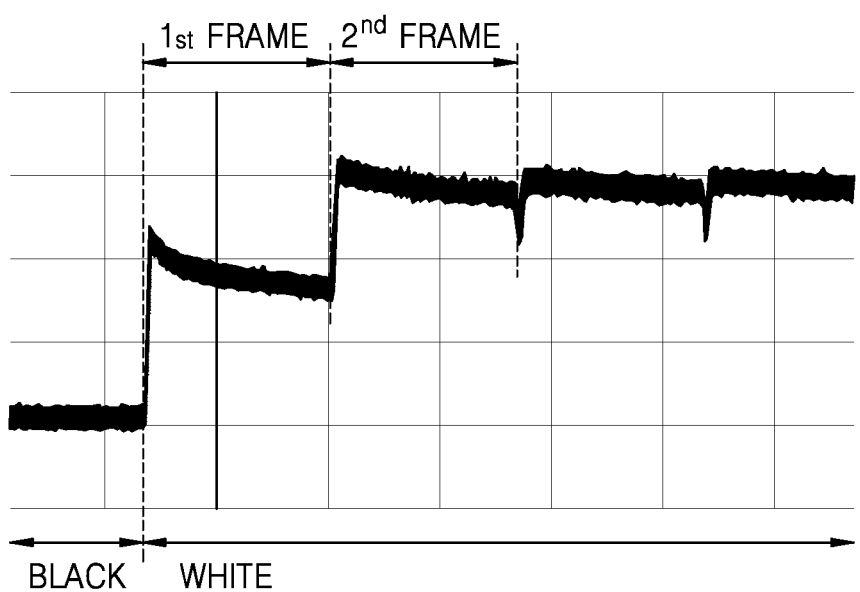
FIG. 6 is a graph illustrating a brightness problem of a display device due to a hysteresis characteristic of a thin film transistor.

Referring to FIGS. 5 and 6, when a second scan signal GW is supplied through the second scan line GWL, a data signal is applied and a threshold voltage of the first transistor T1 is compensated for. The threshold voltage Vth_on and Vth_off changes depending on whether the previous emission state is an on-state or an off-state due to a hysteresis characteristic of the thin film transistor.

Therefore, in the case where a pixel changes to displaying white while displaying black, a brightness difference occurs between white brightness of a first frame in which the first transistor T1 receives a data signal V_DATA under an off-state and compensate a threshold voltage Vth_off and white brightness of a second frame in which the first transistor T1 receives a data signal V_DATA under an on-state and compensate a threshold voltage Vth_on.

To resolve a problem caused by a hysteresis characteristic of a thin film transistor, the embodiment compensates for hysteresis by applying an arbitrary on-bias voltage to the first transistor T1 and shifting the threshold voltage of the first transistor T1 in the same direction before compensation of the threshold voltage. A bias voltage Vgs denotes a difference (Vsource-Vgate) between a voltage Vgate of the gate electrode G1 and a voltage Vsource of the first electrode S1 of the first transistor T1. On-bias voltage is a bias voltage greater than the threshold voltage Vth.

Meanwhile, when the initialization voltage Vint is applied to the gate electrode G1 of the first transistor T1 at the fifth period t5, a voltage of the gate electrode G1 of the first transistor T1 becomes a difference between the initial voltage and a voltage before application of the initial voltage. A voltage of the gate electrode G1 of the first transistor T1 is dropped down by a parasitic capacitance of the first transistor T1, and a voltage of the first electrode S1 of the first transistor T1 is dropped down. In this case, a bias voltage of the first transistor T1 is reduced. Therefore, an output current of the first transistor T1 may be reduced.

Therefore, an embodiment further includes adding, between the power line PL and the first electrode S1 of the first transistor T1 of the pixel PX, the second capacitor Cse for stabilizing a voltage. The second capacitor Cse allows an on-bias voltage to be secured by reducing voltage change of the first electrode S1 of the first transistor T1. As an on-bias voltage is higher, an emission amount of a pixel increases and thus may reduce brightness deviation of a first frame and a second frame displaying white after displaying black.

Also, because capacity of the second capacitor Cse may be designed different for each color pixel and so an on-bias voltage may be set different for each color pixel, an emission amount for each color pixel may be adjusted. Therefore, a difference in emission time due to deviation of an output current for each color pixel may be reduced. Capacity of the second capacitor Cse for each color pixel may be implemented by varying facing areas of electrodes forming the second capacitor Cse.

Figure 7:
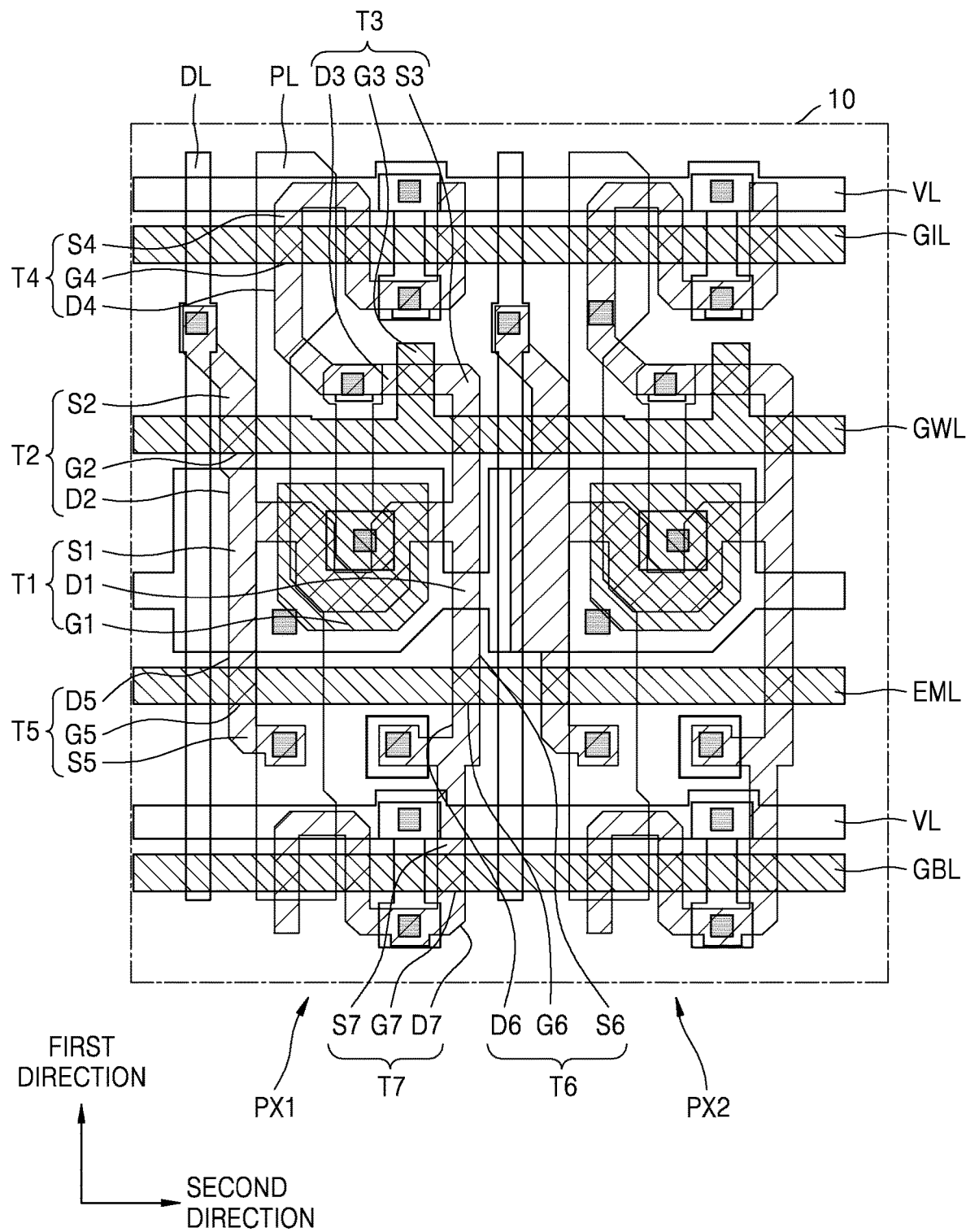
FIG. 7 is a plan view of a pixel circuit of a pixel illustrated in FIG. 2 according to some example embodiments.
Figure 8:
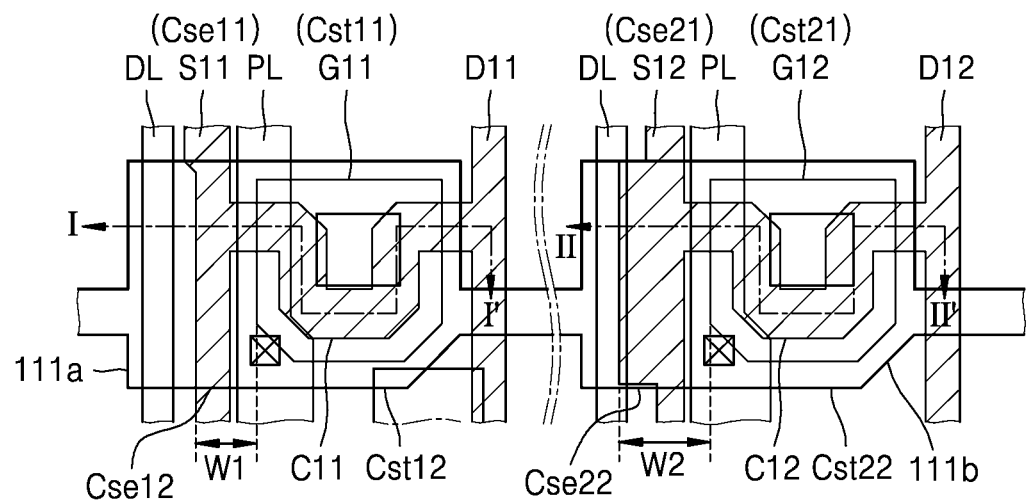
FIG. 8 is an enlarged plan view of a first transistor T1, a first capacitor Cst, and a second capacitor Cse of FIG. 7.
Figure 9:
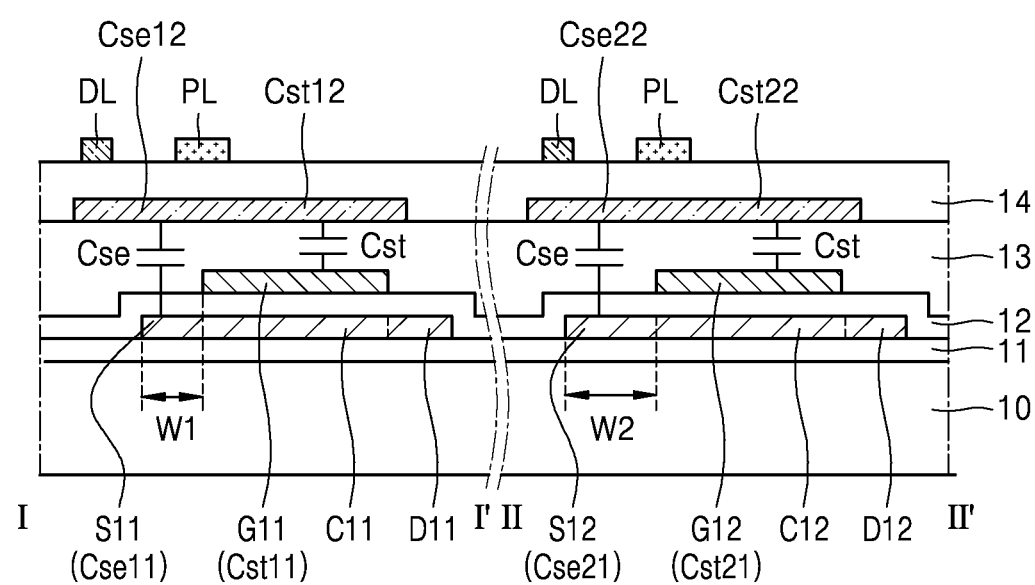
FIG. 9 is a cross-sectional view taken along lines I-I' and II-II' of FIG. 8.

FIG. 7 is a plan view of a pixel circuit of a pixel illustrated in FIG. 2 according to an embodiment. FIG. 8 is an enlarged plan view of a first transistor T1, a first capacitor Cst, and a second capacitor Cse of FIG. 7. FIG. 9 is a cross-sectional view taken along lines I-I' and II-II' of FIG. 8.

An example in which a first pixel PX1 is arranged in a first pixel area, and a second pixel PX2 is arranged in a second pixel area adjacent to the first pixel area is illustrated. Though not shown, a third pixel PX3 may be arranged in a third pixel area adjacent to the second pixel area. Each of the first pixel PX1 to the third pixel PX3 includes a light-emitting element and a pixel circuit connected to the light-emitting element, as illustrated in FIG. 2. FIG. 7 illustrates an example in which a pixel circuit of the first pixel PX1 is arranged in the first pixel area and a pixel circuit of the second pixel PX2 is arranged in the second pixel area, for convenience of illustration. Hereinafter, the first pixel PX1 is mainly described and the description of the first pixel PX1 is equally applied to the second pixel PX2 and the third pixel PX3. The first pixel area to the third pixel area may be sequentially arranged in a second direction.

The first pixels PX1 are arranged at points where a plurality of wirings extending in a first direction cross a plurality of wirings extending in the second direction crossing the first direction. The first scan line GIL, the second scan line GWL, the third scan line GBL, the initialization line VL, and the emission control line EML extend in the second direction. The data line DL and the power line PL extend in the first direction.

Each of the first to seventh transistors T1 to T7 of the pixel circuit includes a semiconductor layer and a gate electrode, the semiconductor layer including a source region, a drain region, and a channel region between the source region and the drain region, the gate electrode being insulated from the semiconductor layer and arranged in a location corresponding to the channel region.

The semiconductor layer may be on a buffer layer 11 (see FIG. 9) on a substrate 10. The buffer layer 11 may be omitted.

The semiconductor layer includes, for example, polycrystalline silicon, and includes a channel region not doped with impurities and a source region and a drain region doped with impurities. Here, the impurities differ depending on a kind of a transistor and may be N-type impurities or P-type impurities. Semiconductor layers of the first to seventh transistors T1 to T7 may be arranged in the same layer, connected to each other, and curved in various shapes. The first electrode and the second electrode of the transistor illustrated in FIG. 2 respectively correspond to the source region and the drain region illustrated in FIG. 7. Hereinafter, the first electrode and the second electrode of the transistor may be used mixed with the source region and the drain region, respectively.

A first insulating layer 12 (see FIG. 9) is arranged between the semiconductor layer and the gate electrode.

The first scan line GIL, the second scan line GWL, the third scan line GBL, and the emission control line EML extend in the second direction and are arranged in a layer in which the gate electrodes G1 to G7 of the first to the seventh transistors T1 to T7 are arranged. A second insulating layer 13 (see FIG. 9) is arranged on the gate electrodes G1 to G7 of the first to the seventh transistors T1 to T7.

The first transistor T1 includes a semiconductor layer and the gate electrode G1, the semiconductor layer including the source region S1, the drain region D1, and a channel region C1. The gate electrode G1 of the first transistor T1 overlaps the channel region C1 in a plan view. The semiconductor layer of the first transistor T1 may allow the channel region C1 to be long by including bending between the source region S1 and the drain region D1. Therefore, a driving range of a gate voltage applied to the gate electrode G1 may be widened. The semiconductor layer of the first transistor T1 may have a curved shape or a bent shape such as '⊏', '⊇', 'S', 'M', and 'W', and various embodiments may be made.

The second transistor T2 includes a semiconductor layer and the gate electrode G2, the semiconductor layer including the source region S2, the drain region D2, and a channel region C2. The gate electrode G2 of the second transistor T2 overlaps the channel region C2 in a plan view. The source region S2 of the second transistor T2 is electrically connected to the data line DL through a contact hole in the first insulating layer 12 to a third insulating layer 14 (see FIG. 9). The drain region D2 of the second transistor T2 is connected to the source region S1 of the first transistor T1.

The third transistor T3 includes a semiconductor layer and the gate electrode G3, the semiconductor layer including the source region S3, the drain region D3, and a channel region C3. The gate electrode G3 of the third transistor T3 overlaps the channel region C3 in a plan view, and is a portion of the second scan line GWL. The source region S3 of the third transistor T3 is connected to the drain region D1 of the first transistor T1, and the drain region D3 is electrically connected to the gate electrode G1 of the first transistor T1 by a connection electrode. The connection electrode connects the drain region D3 of the third transistor T3 to the gate electrode G1 of the first transistor T1 through a contact hole in the first insulating layer 12 to the third insulating layer 14 exposing the drain region D3 of the third transistor T3 and a contact hole in the second insulating layer 13 and the third insulating layer 14 exposing the gate electrode G1 of the first transistor T1.

The fourth transistor T4 includes a semiconductor layer and the gate electrode G4, the semiconductor layer including the source region S4, the drain region D4, and a channel region C4. The gate electrode G4 of the fourth transistor T4 overlaps the channel region C4 in a plan view, and is a portion of the first scan line GIL. The source region S4 of the fourth transistor T4 is electrically connected to the initialization line VL by a connection electrode, and the drain electrode D4 is electrically connected to the drain region D3 of the third transistor T3 and the gate electrode G1 of the first transistor T1. The connection electrode connects the source region S4 of the fourth transistor T4 to the initialization line VL through a contact hole in the first insulating layer 12 to the third insulating layer 14 exposing the source region S4 of the fourth transistor T4, and a contact hole in the third insulating layer 14 exposing the initialization line VL. The initialization line VL is arranged in a layer in which the second electrode Cst2 of the first capacitor Cst is arranged.

The fifth transistor T5 includes a semiconductor layer and the gate electrode G5, the semiconductor layer including the source region S5, the drain region D5, and a channel region C5. The gate electrode G5 of the fifth transistor T5 overlaps the channel region C5 in a plan view, and is a portion of the emission control line EML. The source region S5 of the fifth transistor T5 is electrically connected to the power line PL through a contact hole in the first insulating layer 12 to the third insulating layer 14 exposing a portion of the source electrode S5, and the drain region D5 is connected to the first electrode S1 of the first transistor T1.

The sixth transistor T6 includes a semiconductor layer and the gate electrode G6, the semiconductor layer including the source region S6, the drain region D6, and a channel region C6. The gate electrode G6 of the sixth transistor T6 overlaps the channel region C6 in a plan view, and is a portion of the emission control line EML. The source region S6 of the sixth transistor T6 is connected to the drain region D1 of the first transistor T1, and the drain region D6 is electrically connected to the pixel electrode of the OLED. The drain region D6 of the sixth transistor T6 is electrically connected to a connection electrode on the third insulating layer 14 through a contact hole in the first insulating layer 12 to the third insulating layer 14 exposing a portion of the drain region D6. The pixel electrode is electrically connected to the connection electrode through a via hole in a fourth insulating layer on the connection electrode connected to the drain region D6 of the sixth transistor T6, and thus connected to the drain region D6 of the sixth transistor T6.

The seventh transistor T7 includes a semiconductor layer and the gate electrode G7, the semiconductor layer including the source region S7, the drain region D7, and a channel region C7. The gate electrode G7 of the seventh transistor T7 overlaps the channel region C7 in a plan view, and is a portion of the third scan line GBL. The drain region D7 of the seventh transistor T7 is connected to the source region S4 of the fourth transistor T4, and the source region S7 is connected to the drain region D6 of the sixth transistor T6.

The first electrode Cst1 of the first capacitor Cst serves as the gate electrode G1 of the first transistor T1. That is, the first electrode Cst1 of the first capacitor Cst and the gate electrode G1 of the first transistor T1 may be understood as one body. The first electrode Cst1 of the first capacitor Cst is separated from an adjacent pixel, has a quadrangular shape, includes the same material as that of the first scan line GIL, the second scan line GWL, the third scan line GBL, and the emission control line EML, and is arranged in a layer in which the first scan line GIL, the second scan line GWL, the third scan line GBL, and the emission control line EML are arranged.

The second electrode Cst2 of the first capacitor Cst is connected to second electrodes Cst2 of adjacent pixels in the second direction, that is, pixels in the same row. The second electrode Cst2 of the first capacitor Cst overlaps the first electrode Cst1 to entirely cover the first electrode Cst1, and has a structure vertically overlapping the first transistor T1 in a plan view and in cross-sectional view. The second insulating layer 13 between the first electrode Cst1 and the second electrode Cst2 of the first capacitor Cst serves as a dielectric layer. The second electrode Cst2 of the first capacitor Cst includes an opening in a location corresponding to a contact hole exposing a portion of the first electrode Cst1.

The third insulating layer 14 is arranged on the second electrode Cst2 of the first capacitor Cst. The data line DL and the power line PL on the third insulating layer 14 extend in the first direction. The power line PL partially overlaps the second electrode Cst2 of the first capacitor Cst.

The second electrode Cst2 of the first capacitor Cst is electrically connected to the power line PL through a contact hole in the third insulating layer 14 exposing a portion of the second electrode Cst2. Therefore, the power line PL serves as a power line in the first direction, and the second electrode Cst2 of the first capacitor Cst serves as a power line in the second direction, and thus, the power line PL may have a mesh structure as a whole. Also, the power line PL is electrically connected to the source region S5 of the fifth transistor T5.

The first electrode Cse1 of the second capacitor Cse is at least a portion of the source region S1 of the first transistor T1. That is, the first electrode Cse1 of the second capacitor Cse and the source region S1 of the first transistor T1 may be understood as one body.

The second electrode Cse2 of the second capacitor Cse is an electrode layer extending from the second electrode Cst2 of the first capacitor Cst and covering at least a portion of the source region S1 of the first transistor T1. That is, the second electrode Cse2 of the second capacitor Cse and the second electrode Cst2 of the first capacitor Cst may be understood as one body.

Referring to FIGS. 8 and 9, for convenience of description, different reference numerals are used to discriminate the first transistor T1 of the first pixel PX1 from the first transistor T1 of the second pixel PX2.

The first transistor T1 of the first pixel PX1 includes a semiconductor layer and a gate electrode G11, the semiconductor layer including a source region S11, a drain region D11, and a channel region C11, the gate electrode G11 corresponding to the channel region C11. The first capacitor Cst and the second capacitor Cse are provided to vertically overlap the first transistor T1 in a plan view and in cross-sectional view.

An electrode layer 111a over the gate electrode G11 of the first transistor T1 includes a first region overlapping the gate electrode G11 of the first transistor T1 and a second region overlapping the source region S11 of the first transistor T1.

The first region of the electrode layer 111a serves as a second electrode Cst12 of the first capacitor Cst. The second region of the electrode layer 111a serves as a second electrode Cse12 of the second capacitor Cse. The electrode layer 111a is electrically connected to the power line PL.

The first capacitor Cst of the first pixel PX1 includes a first electrode Cst11, which is the gate electrode G11 of the first transistor T1, and the second electrode Cst12 facing the first electrode Cst11. The second capacitor Cse of the first pixel PX1 includes a first electrode Cse11, which is the source region S11 of the first transistor T1 and the second electrode Cse12 facing the first electrode Cse11. The second electrode Cst12 of the first capacitor Cst and the second electrode Cse12 of the second capacitor Cse are electrically connected to the power line PL through a contact hole in the third insulating layer 14.

The first transistor T1 of the second pixel PX2 includes a semiconductor layer and a gate electrode G12, the semiconductor layer including a source region S12, a drain region D12, and a channel region C12, the gate electrode G12 corresponding to the channel region C12. The first capacitor Cst and the second capacitor Cse are provided to vertically overlap the first transistor T1 in a plan view and in cross-sectional view.

An electrode layer 111b over the gate electrode G12 of the first transistor T1 includes a first region overlapping the gate electrode G12 of the first transistor T1 and a second region overlapping the source region S12 of the first transistor T1.

The first region of the electrode layer 111b serves as a second electrode Cst22 of the first capacitor Cst. The second region of the electrode layer 111b serves as a second electrode Cse2 of the second capacitor Cse. The electrode layer 111b is electrically connected to the power line PL.

The first capacitor Cst of the second pixel PX2 includes a first electrode Cst21, which is the gate electrode G12 of the first transistor T1, and the second electrode Cst22 facing the first electrode Cst11. The second capacitor Cse of the second pixel PX2 includes a first electrode Cse21, which is the source region S12 of the first transistor T1 and the second electrode Cse22 facing the first electrode Cse21. The second electrode Cst22 of the first capacitor Cst and the second electrode Cse22 of the second capacitor Cse are electrically connected to the power line PL through a contact hole in the third insulating layer 14.

The lengths, the widths, or the areas of the electrode layer 111a and the electrode layer 111b are the same. The length is a size in the second direction or in a width direction of the source region S of the first transistor T1.

A width W2 of the first electrode Cse21 of the second capacitor Cse of the second pixel PX2 is greater than a width W1 of the first electrode Cse11 of the second capacitor Cse of the first pixel PX1. Therefore, an area of an overlapping region of the source region S12 of the first transistor T1 and the second electrode Cse22 in the second pixel PX2 is greater than an area of an overlapping region of the source region S11 of the first transistor T1 and the second electrode Cse12 in the first pixel PX1. Therefore, a capacity of the second capacitor Cse of the second pixel PX2 is greater than a capacity of the second capacitor Cse of the first pixel PX1.

An embodiment may induce on-bias voltage deviation of the first pixel PX1 and the second pixel PX2 by using a capacity difference of the second capacitor Cse through width adjustment of the source region S1 of the first transistor T1. Therefore, a light emission delay difference between pixels may be reduced by making a response speed faster by applying a strong on-bias voltage on the second pixel PX2 compared to the first pixel PX1.

A capacity of the second capacitor Cse of the third pixel PX3 arranged in the third pixel area may be same as or different from a capacity of the second capacitor Cse of the first pixel PX1 or a capacity of the second capacitor Cse of the second pixel PX2. That is, a width of the second capacitor Cse of the third pixel PX3 corresponding to the source region S1 of the first transistor T1 may be same as or different from a width of the second capacitor Cse of the first pixel PX1 or the second pixel PX2 corresponding to the source region S1 of the first transistor T1.

Figure 10:
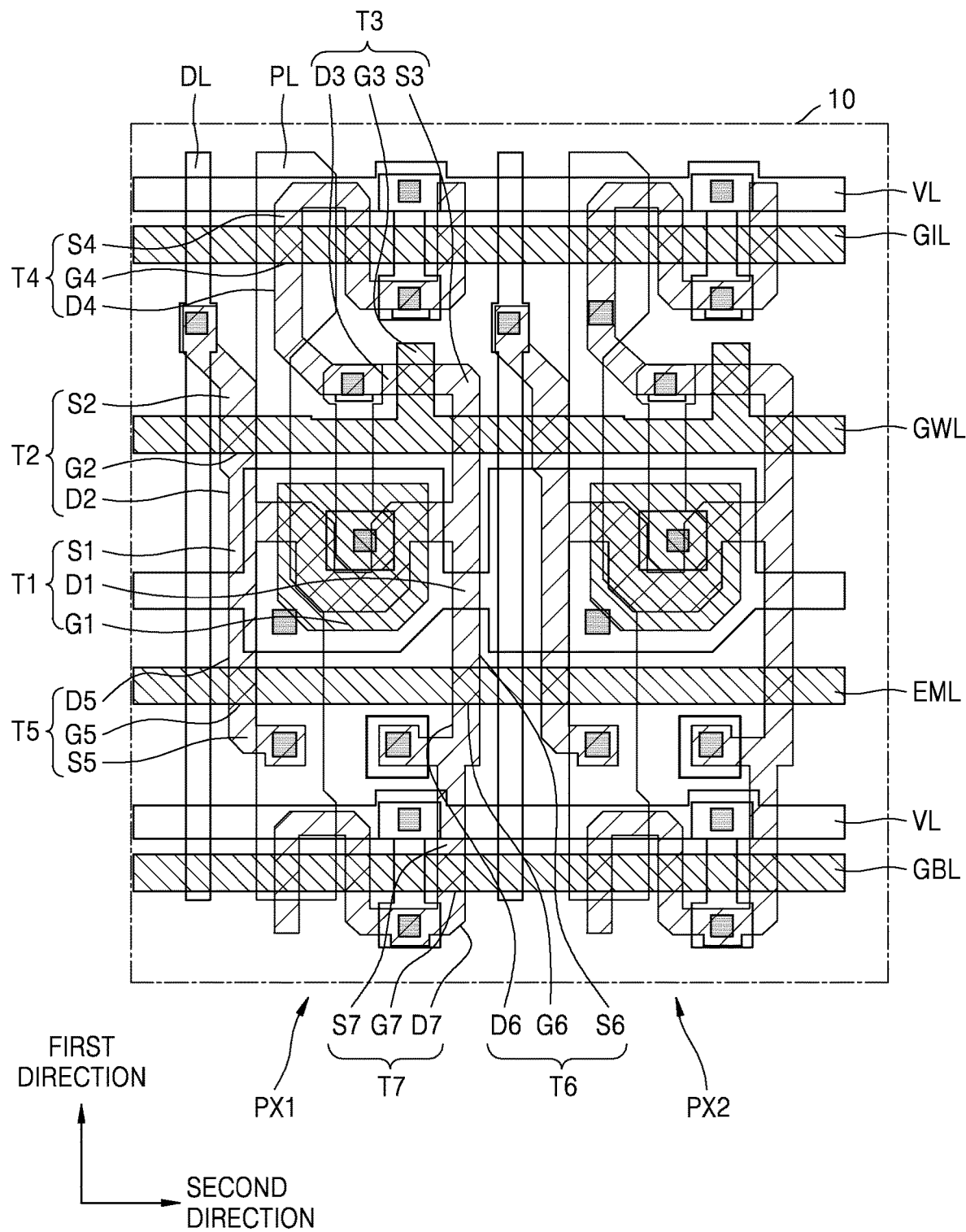
FIG. 10 is a plan view of a pixel circuit of a pixel illustrated in FIG. 2 according to some example embodiments.
Figure 11:
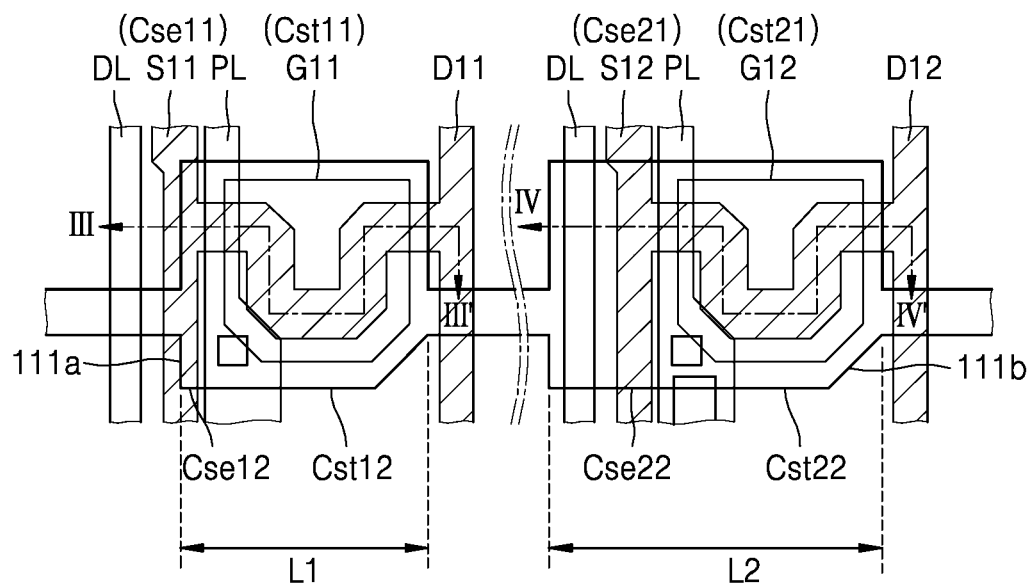
FIG. 11 is an enlarged plan view of a first transistor T1, a first capacitor Cst, and a second capacitor Cse of FIG. 10.
Figure 12:
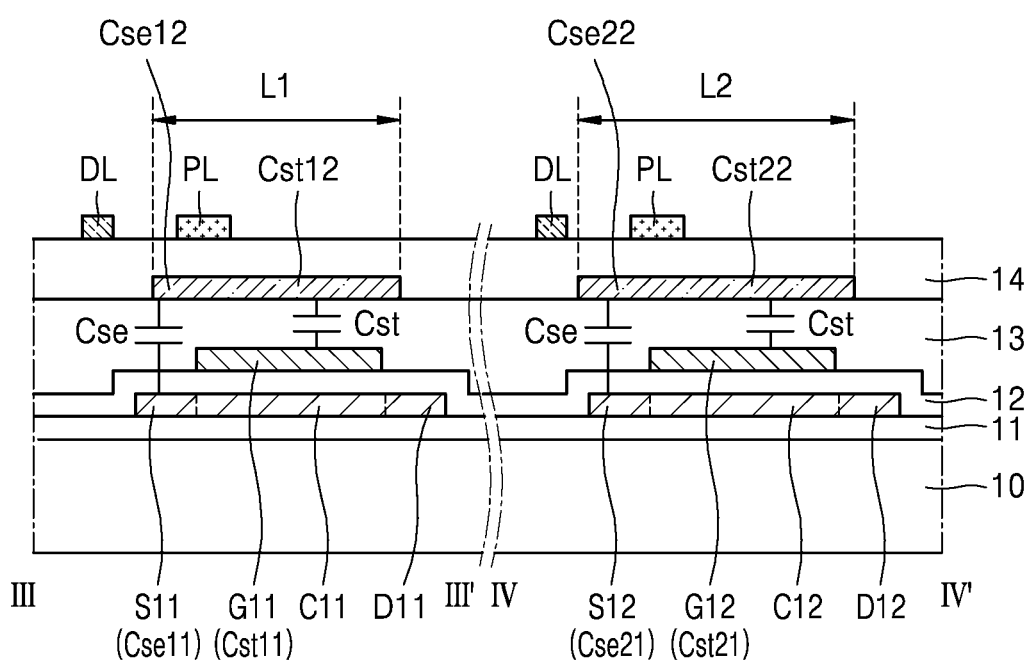
FIG. 12 is a cross-sectional view taken along lines III-III' and IV-IV' of FIG. 11.

FIG. 10 is a plan view of a pixel circuit of a pixel illustrated in FIG. 2 according to another embodiment. FIG. 11 is an enlarged plan view of a first transistor T1, a first capacitor Cst, and a second capacitor Cse of FIG. 10. FIG. 12 is a cross-sectional view of the first transistor T1, the first capacitor Cst, and the second capacitor Cse taken along lines III-III' and IV-IV' of FIG. 11. Hereinafter, contents different from those of FIGS. 7 to 8 are mainly described.

FIG. 10 is different from FIG. 7 in that a size of an electrode layer over the gate electrode G1 of the first transistor T1 of the first pixel PX1 and the second pixel PX2 is different from that of FIG. 7.

Referring to FIGS. 11 and 12, a length L2 of an electrode layer 111b of the second pixel PX2 is longer than a length L1 of an electrode layer 111a of the first pixel PX1. The electrode layer 111b of the second pixel PX2 covers all of the gate electrode G12 and the source region S12 of the first transistor T1. In contrast, the electrode layer 111a of the first pixel PX1 covers the gate electrode G11 of the first transistor T1 and a portion of the source region S11 of the first transistor T1. A width of the source region S11 of the first transistor T1 of the first pixel PX1 is the same as or equal to a width of the source region S12 of the first transistor T1 of the second pixel PX2.

Therefore, an area of an overlapping region of the source region S12 of the first transistor T1 and the second electrode Cse22 in the second pixel PX2 is greater than an area of an overlapping region of the source region S11 of the first transistor T1 and the second electrode Cse12 in the first pixel PX1. Therefore, a capacity of the second capacitor Cse of the second pixel PX2 is greater than a capacity of the second capacitor Cse of the first pixel PX1.

An embodiment may induce on-bias voltage deviation of the first pixel PX1 and the second pixel PX2 by using a capacity difference of the second capacitor Cse through length or area adjustment of the second electrode Cse2 of the second capacitor Cse. Therefore, a light emission delay difference between pixels may be reduced by making a response speed faster by applying a strong on-bias voltage on the second pixel PX2 compared to the first pixel PX1.

A capacity of the second capacitor Cse of the third pixel PX3 arranged in the third pixel area may be same as or different from a capacity of the second capacitor Cse of the first pixel PX1 or a capacity of the second capacitor Cse of the second pixel PX2. That is, a length or an area of the second electrode Cse2 of the second capacitor Cse of the third pixel PX3 may be same as or different from a length or an area of the second electrode Cse2 of the second capacitor Cse of the first pixel PX1 or the second pixel PX2.

Figure 13:
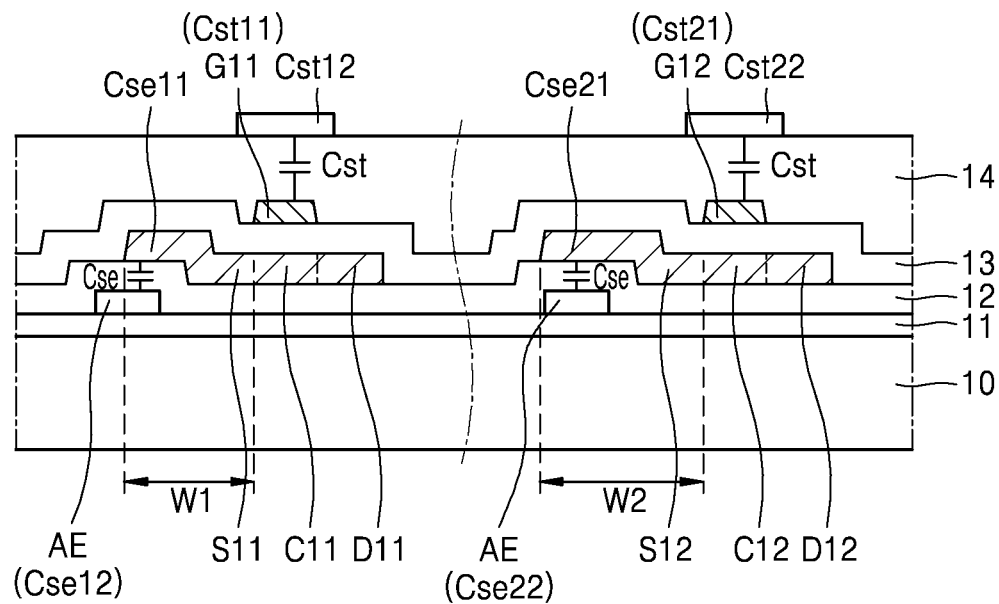
FIGS. 13 and 14 are enlarged cross-sectional views of a first transistor T1, a first capacitor Cst, and a second capacitor Cse according to some example embodiments.
Figure 14:
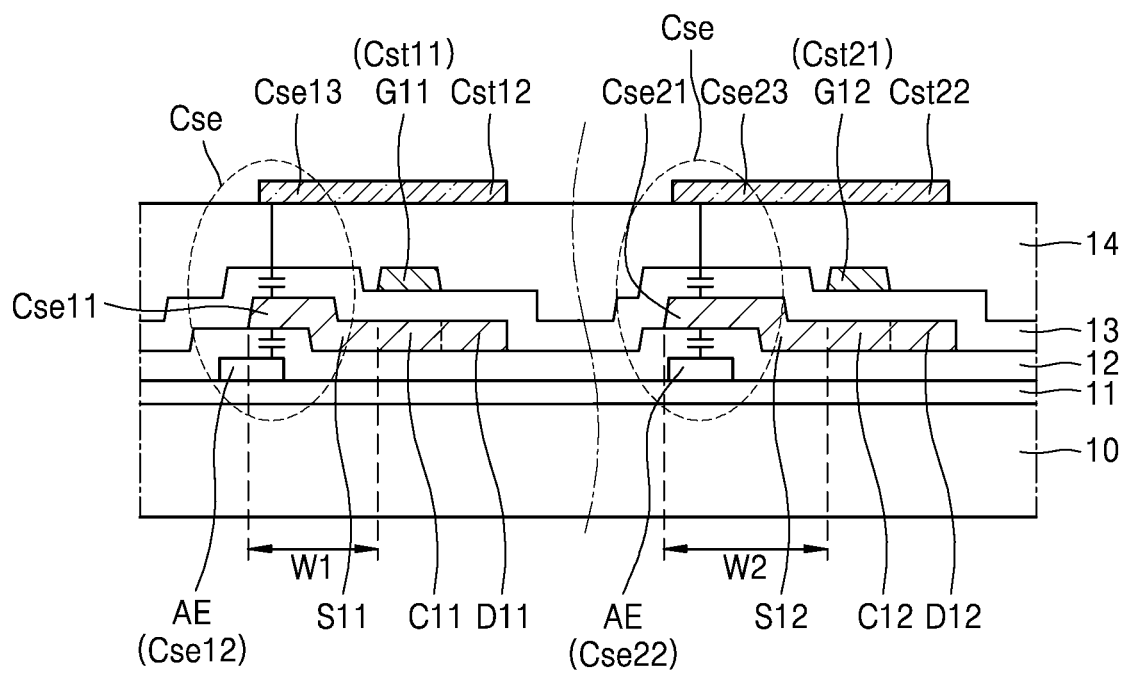

FIGS. 13 and 14 are enlarged cross-sectional views of a first transistor T1, a first capacitor Cst, and a second capacitor Cse according to another embodiment. Hereinafter, contents different from those of FIGS. 7 to 12 are mainly described.

Referring to FIG. 13, the first transistor T1 of the first pixel PX1 is arranged in the first pixel area of the substrate 10, and the first transistor T1 of the second pixel PX2 is arranged in the second pixel area.

An auxiliary electrode AE is arranged on the buffer layer 11 on the substrate 10. The first insulating layer 12 is arranged on the auxiliary electrode AE, and a semiconductor layer of the first transistor T1 is arranged on the first insulating layer 12. The second insulating layer 13 is arranged on the semiconductor layer, and the gate electrode is arranged on the second insulating layer 13. The third insulating layer 14 is arranged on the gate electrode, and the electrode layer overlapping the gate electrode is arranged on the third insulating layer 14. The electrode layer may be one electrode of the first capacitor Cst.

The semiconductor layer of the first transistor T1 of the first pixel PX1 includes the source region S11, the drain region D11, and the channel region C11 corresponding to the gate electrode G11. The first capacitor Cst includes the first electrode Cst11, which is the gate electrode G11 of the first transistor T1, and the second electrode Cst12 over the first electrode Cst11. The second capacitor Cse includes the first electrode Cse11, which is a portion of the source region S11 of the first transistor T1, and the second electrode Cse12, which is the auxiliary electrode AE facing the first electrode Cse11. A same voltage may be applied to the second electrode Cst12 of the first capacitor Cst and the auxiliary electrode AE. For example, the second electrode Cst12 of the first capacitor Cst and the auxiliary electrode AE are electrically connected to the power line PL and thus may receive the first power voltage ELVDD. Alternatively, different voltages may be respectively applied to the second electrode Cst12 of the first capacitor Cst and the auxiliary electrode AE. For example, the second electrode Cst12 of the first capacitor Cst may be electrically connected to the power line PL and may receive the first power voltage ELVDD, and the auxiliary electrode AE may receive a separate constant voltage.

The semiconductor layer of the first transistor T1 of the second pixel PX2 includes the source region S12, the drain region D12, and the channel region C12 corresponding to the gate electrode G12. The first capacitor Cst includes the first electrode Cst21, which is the gate electrode G12 of the first transistor T1, and the second electrode Cst22 over the first electrode Cst21. The second capacitor Cse includes the first electrode Cse21, which is a portion of the source region S12 of the first transistor T1, and the second electrode Cse22, which is the auxiliary electrode AE facing the first electrode Cse21. A same voltage may be applied to the second electrode Cst22 of the first capacitor Cst and the auxiliary electrode AE. For example, the second electrode Cst22 of the first capacitor Cst and the auxiliary electrode AE are electrically connected to the power line PL and thus may receive the first power voltage ELVDD. Alternatively, different voltages may be respectively applied to the second electrode Cst22 of the first capacitor Cst and the auxiliary electrode AE. For example, the second electrode Cst22 of the first capacitor Cst may be electrically connected to the power line PL and may receive the first power voltage ELVDD, and the auxiliary electrode AE may receive a separate constant voltage.

A width W2 of the source region S12 of the first transistor T1 of the second pixel PX2 is greater than a width W1 of the source region S11 of the first transistor T1 of the first pixel PX1. Therefore, an area of an overlapping region of the source region S12 of the first transistor T1 and the second electrode Cse22 in the second pixel PX2 is greater than an area of an overlapping region of the source region S11 of the first transistor T1 and the second electrode Cse12 in the first pixel PX1. Therefore, a capacity of the second capacitor Cse of the second pixel PX2 is greater than a capacity of the second capacitor Cse of the first pixel PX1.

Referring to FIG. 14, the first transistor T1 of the first pixel PX1 is arranged in the first pixel area of the substrate 10, and the first transistor T1 of the second pixel PX2 is arranged in the second pixel area.

An embodiment of FIG. 14 is different from the embodiment of FIG. 13 in that the electrode layer on the third insulating layer 14 illustrated in the embodiment of FIG. 13 covers the gate electrode of the first transistor T1 and the source region.

The second capacitor Cse of the first pixel PX1 includes a capacitor including the first electrode Cse11, which is a portion of the source region S11 of the first transistor T1, and the second electrode Cse12, which is the auxiliary electrode facing the first electrode Cse11, and a capacitor including the first electrode Cse11, which is a portion of the source region S11 of the first transistor T1, and a third electrode Cse13, which is a portion of the electrode layer facing the first electrode Cse11.

A same voltage may be applied to the third electrode Cse13 of the second capacitor Cse and the auxiliary electrode AE. For example, the third electrode Cse13 of the second capacitor Cse and the auxiliary electrode AE may be electrically connected to the power line PL and may receive the first power voltage ELVDD.

The second capacitor Cse of the second pixel PX2 includes a capacitor including the first electrode Cse21, which is a portion of the source region S12 of the first transistor T1, and the second electrode Cse22, which is the auxiliary electrode facing the first electrode Cse21, and a capacitor including the first electrode Cse21, which is a portion of the source region S12 of the first transistor T1, and a third electrode Cse23, which is a portion of the electrode layer facing the first electrode Cse21.

A same voltage may be applied to the third electrode Cse23 of the second capacitor Cse and the auxiliary electrode AE. For example, the third electrode Cse23 of the second capacitor Cse and the auxiliary electrode AE may be electrically connected to the power line PL and may receive the first power voltage ELVDD.

The embodiment of FIG. 14 may apply a stronger on-bias voltage on a pixel by increasing a capacity through parallel connection of second capacitors.

Figure 15:
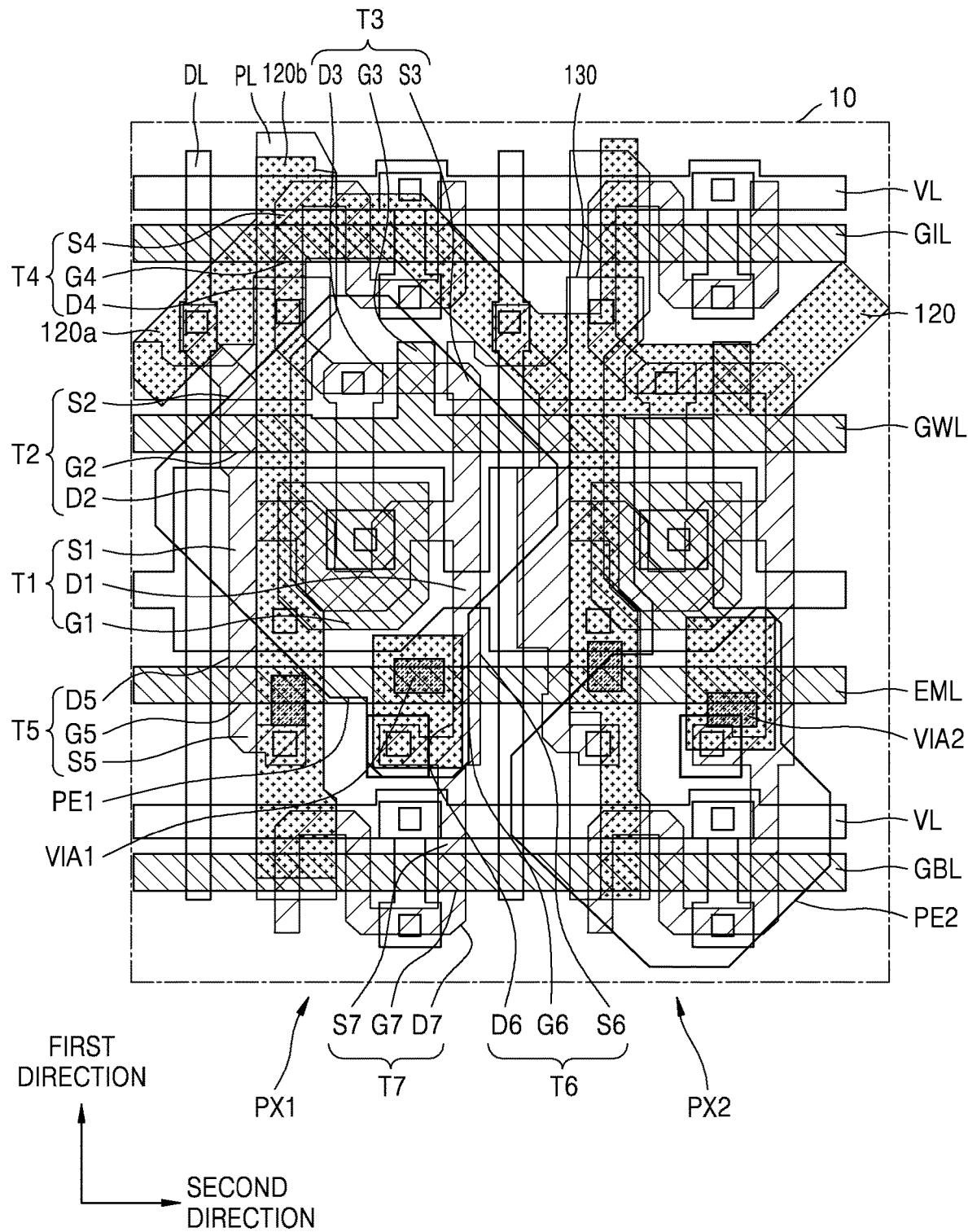
FIG. 15 is a plan view in which a pixel electrode and a light-shielding member are further arranged in a pixel circuit illustrated in FIG. 3.

FIG. 15 is a plan view in which a pixel electrode and a light-shielding member are further arranged in a pixel circuit illustrated in FIG. 7.

Referring to FIG. 15, a first pixel electrode PE1 electrically connected to a pixel circuit is arranged on the pixel circuit of the first pixel PX1 arranged in the first pixel area. A second pixel electrode PE2 electrically connected to a pixel circuit is arranged on the pixel circuit of the second pixel PX2 arranged in the second pixel area. The first pixel electrode PE1 may be adjacent to the second pixel electrode PE2 in a diagonal direction in a plan view.

The first pixel electrode PE1 is electrically connected to the drain region D6 of the sixth transistor T6 of the first pixel PX1 through a via hole VIA1. At least a portion of the first pixel electrode PE1 overlaps the first transistor T1 and at least one of the source region S3 or the drain region D3 of the third transistor T3.

The second pixel electrode PE2 is electrically connected to the drain region D6 of the sixth transistor T6 of the second pixel PX2 through a via hole VIA2. At least a portion of the second pixel electrode PE2 overlaps the sixth transistor T6 and the seventh transistor T7.

When an off-current occurs due to external light with at least one transistor connected to the first transistor T1 of a pixel PX turned off, a leakage current is introduced to the first transistor T1 and color deviation between color pixels may occur.

An embodiment covers, by using a pixel electrode or a light-shielding member, a source region and a drain region of at least one transistor connected to the first transistor T1 of a pixel PX exposed to external light. For example, the light-shielding member may cover at least a portion of the source region and the drain region of the third transistor T3 and/or the fourth transistor T4. An arrangement location of the light-shielding member may be determined by arrangement of a pixel electrode.

In an embodiment, the light-shielding member may include a semiconductor material. In another embodiment, the light-shielding member may include a same material as those of a plurality of wirings (e.g., a scan line, a data line, an initialization line, etc.) and a pixel electrode inside a pixel.

In an embodiment of FIG. 15, a light-shielding member may include a first light-shielding member 120 arranged between the pixel electrode PE and the power line PL in cross-sectional view. The first light-shielding member 120 may include a first region 120a and a second region 120b, the first region 120a extending in zigzags in a second direction along a periphery of pixel electrodes PE of adjacent pixels PX, the second region 120b overlapping the power line PL of each pixel PX in a plan view and extending in a first direction. A portion of the first light-shielding member 120 may overlap at least a portion of the pixel electrode PE and the power line PL in a plan view. The light-shielding member may further include a second light-shielding member 130 arranged in a layer in which the initialization line VL is arranged.

The first pixel electrode PE1 covers the source region S3 and the drain region D3 of the third transistor T3 of the first pixel PX1.

The first light-shielding member 120 covers at least a portion of the source region S3 and the drain region D3 of the third transistor T3, at least a portion of the source region S4 and the drain region D4 of the fourth transistor T4 of the second pixel PX2, and at least a portion of the source region S4 and the drain region D4 of the fourth transistor T4 of the first pixel PX1.

The second light-shielding member 130 covers at least a portion of the source region S2 and the drain region D2 of the second transistor T2, and at least a portion of the source region S4 and the drain region D4 of the fourth transistor T4.

The first light-shielding member 120 and the second light-shielding member 130 may be electrically connected to the power line PL. The first light-shielding member 120 and/or the second light-shielding member 130 may be connected to the power line PL and may receive a constant voltage, thereby preventing the second transistor T2, the third transistor T3, and the fourth transistor T4 from being influenced by other neighboring electric signals. That is, the first light-shielding member 120 and the second light-shielding member 130 may improve an operation characteristic of a circuit of the pixel PX.

An embodiment allows a source region and a drain region of a thin film transistor not to be exposed to external light by using a pixel electrode and/or a light-shielding member. The light-shielding member may be arranged at an appropriate location of an appropriate layer to cover at least a portion of a source region and a drain region of a thin film transistor which is not covered by a pixel electrode.

Though not shown, a pixel-defining layer including an opening exposing a portion of a pixel electrode may be arranged on the pixel electrode. An emission layer may be arranged in the opening of the pixel-defining layer, and thus the opening may correspond to an emission portion of the pixel electrode. A common electrode facing the pixel electrode may be arranged on the emission layer.

Figure 16:
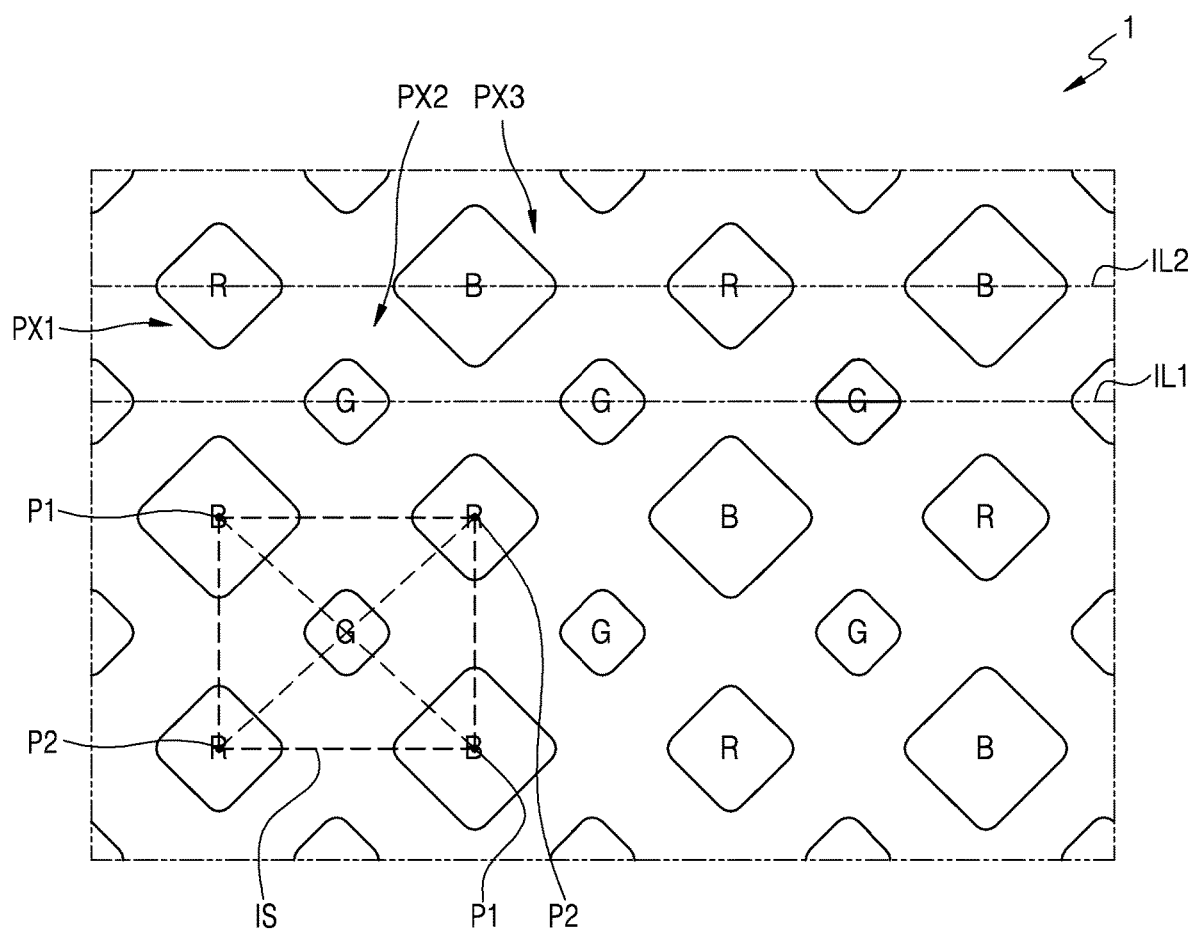
FIG. 16 is a partial plan view of a display device according to some example embodiments.

FIG. 16 is a partial plan view of a display device 1 according to an embodiment.

Referring to FIG. 16, a plurality of pixels may be arranged in a display area DA of the display device 1. FIG. 16 illustrates an emission portion of a pixel electrode configuring a light-emitting element of a pixel, and omits a pixel circuit arranged below the pixel electrode. At least one insulating layer may be arranged between the pixel circuit and the pixel electrode. An area (referred to as an 'emission area') of the emission portion of the pixel electrode may be proportional to an area of the pixel electrode. Because the emission area of the pixel electrode determines an aperture ratio of the pixel, hereinafter, for convenience of description, the emission portion and the emission area of the pixel electrode illustrated in FIG. 16 are used mixed with a pixel and an area of the pixel, respectively.

The display device 1 includes a plurality of first pixels PX1, a plurality of second pixels PX2, and a plurality of third pixels PX3. The first pixel PX1, the second pixel PX2, and the third pixel PX3 may be repeatedly arranged along a preset pattern in a row direction and a column direction.

The second pixel PX2 may have an area less than those of the adjacent first pixel PX1 and third pixel PX3. The second pixel PX2 may be a green pixel G emitting green light. The second pixels PX2 may be spaced apart from each other and arranged on a virtual first straight line IL1. The second pixel PX2 may have a shape such as a polygon including a quadrangle and an octagon, a circle, and an ellipse. The polygon may include a rounded polygon.

The third pixel PX3 is located at a pair of first vertexes P1 of a virtual quadrangle IS in which the second pixel PX2 is centered on a center of a square, the pair of first vertexes P1 facing each other. The first pixel PX1 is located at a pair of second vertexes P2 of the virtual quadrangle IS. The virtual quadrangle IS may be a square.

The first pixel PX1 is spaced apart from the second pixel PX2 and the third pixel PX3, and centered on the second vertex P2 adjacent to the first vertex P1 of the virtual square IS. The first pixel PX1 may have a larger area than that of the adjacent second pixel PX2. The first pixel PX1 may be red pixel R emitting red light. The first pixel PX1 may have a shape such as a polygon including a quadrangle and an octagon, a circle, and an ellipse. The polygon may include a rounded polygon.

The third pixel PX3 is spaced apart from the first pixel PX1 and the second pixel PX2, and centered on the first vertex P1 of the virtual square IS. The third pixel PX3 may have a larger area than that of the adjacent second pixel PX2. Also, the third pixel PX3 may have an area different from that of the first pixel PX1. For example, the third pixel PX3 may have a larger area than that of the first pixel PX1. In another embodiment, the third pixel PX3 may have a same area as that of the first pixel PX1. The third pixel PX3 may be a blue pixel B emitting blue light. The third pixel PX3 may have a shape such as a polygon including a quadrangle and an octagon, a circle, and an ellipse. The polygon may include a rounded polygon.

The plurality of first pixels PX1 and the plurality of third pixels PX3 are alternately arranged on a second virtual straight line IL2, and thus the plurality of third pixels PX3 centered on the first vertexes P1 and the plurality of first pixels PX1 centered on the second vertexes P2 surround the second pixels PX2.

Meanwhile, in a pixel arrangement structure of the display device 1 according to an embodiment, the first pixel PX1, the second pixel PX2, and the third pixel PX3 emit red light, green light, and blue light, respectively, but are not limited thereto and may emit light different from red, green, and blue light. For example, one or more pixels among the first pixel PX1 to the third pixel PX3 may emit white light.

Each of the first pixel PX1 to the third pixel PX3 may include a pixel circuit and a light-emitting element connected to the pixel circuit as illustrated in FIG. 2.

Pixel circuits of the first pixel PX1 to the third pixel PX3 may be respectively arranged in the first pixel area to the third pixel area in the first direction as illustrated in FIG. 7. Light-emitting elements of the first pixel PX1 to the third pixel PX3 may be arranged at locations corresponding to pixel electrodes as illustrated in FIG. 15.

In an embodiment, the first pixel PX1 arranged in the first pixel area of FIG. 15 and the second pixel PX2 arranged in the second pixel area may be respectively the red pixel R (or the blue pixel B) and the green pixel G illustrated in FIG. 16.

In the case of the pixel arrangement illustrated in FIG. 16, a driving current of a green pixel G is smaller than those of a red pixel R and a blue pixel B, and so a light emission time of the green pixel G is relatively late. Therefore, a purple color spreading phenomenon may occur.

Therefore, deviation of a light emission time may be reduced by making a capacity of a second capacitor Cse of the green pixel G higher than capacities of second capacitors Cse of the red pixel R and the blue pixel B, making a high on-bias voltage of the green pixel G, and thus increasing a driving current of the green pixel G according to an embodiment.

For example, when the capacitance of second capacitors Cse of a green pixel G, a red pixel R, and a blue pixel B were equally 9.2 fF, bias voltages Vgs of the green pixel G, the red pixel R, and the blue pixel B were respectively −5.76 fF, −5.65 fF, and −5.58 fF. Table 1 below represents change in a bias voltage Vgs depending on a capacity change in the second capacitor Cse of the green pixel G with the second capacitors of the red pixel R and the blue pixel B maintained at 9.2 fF.

TABLE 1

| Cse [fF] | Vgs_G[V] | ΔVgs compared to R | ΔVgs compared to B |
|---|---|---|---|
| 12 | −5.97 | −0.32 | −0.39 |
| 14 | −6.16 | −0.51 | −0.58 |
| 16 | −6.33 | −0.68 | −0.75 |
| 18 | −6.49 | −0.84 | −0.91 |

Table 1 shows that a bias voltage of the green pixel G increases as a capacity of the second capacitor Cse of the green pixel G increase. Therefore, a light emission time of the green pixel G may be approximated to those of the red pixel R and the blue pixel B by maintaining emission amounts of the red pixel R and the blue pixel B, increasing an emission amount of the green pixel G, and improving a response speed of the green pixel G.

A display device according to embodiments differentiates, for each color pixel, an on-bias voltage through a capacity control of stabilization capacitors by adjusting an area (a size) of opposite electrodes of the stabilization capacitors connected to a source electrode of a driving transistor. Therefore, an emission amount and a light emission time may be adjusted for each color pixel by controlling an on-bias voltage for each color pixel. Therefore, because a light emission delay deviation between color pixels may be reduced, color spreading and/or color blurring may be reduced.

A display device according to an embodiment may provide a high-quality image by preventing a color spreading phenomenon.

Although the disclosure has been described with reference to the embodiments illustrated in the drawings, this is merely provided as an example and it will be understood by those of ordinary skill in the art that various changes in form and details and equivalents thereof may be made therein without departing from the spirit and scope of the disclosure as defined by the following claims, and their equivalents.

What is claimed is:

1. A display device, comprising:
a first pixel circuit comprising a first driving transistor comprising a first gate electrode and a first semiconductor layer, the first semiconductor layer comprising a first source region and a first drain region; and
a second pixel circuit comprising a second driving transistor comprising a second gate electrode and a second semiconductor layer, the second semiconductor layer comprising a second source region and a second drain region,
wherein a width of the first source region of the first driving transistor and a width of the second source region of the second driving transistor are different from each other, and
wherein a width and a length of a first channel region of the first driving transistor and a width and a length of a second channel region of the second driving transistor are the same.

2. The display device of claim 1, further comprising:
a first electrode layer over the first gate electrode and overlapping the first gate electrode; and
a second electrode layer over the second gate electrode and overlapping the second gate electrode.

3. The display device of claim 2, wherein the first electrode layer overlaps at least a portion of the first source region of the first driving transistor, and the second electrode layer overlaps at least a portion of the second source region of the second driving transistor.

4. The display device of claim 1, further comprising:
a first auxiliary electrode below the first source region of the first driving transistor and overlapping at least a portion of the first source region of the first driving transistor; and
a second auxiliary electrode below the second source region of the second driving transistor and overlapping at least a portion of the second source region of the second driving transistor.

5. The display device of claim 2, further comprising:
a first power line electrically connected to the first electrode layer; and
a second power line electrically connected to the second electrode layer.

6. The display device of claim 5, wherein the first power line is over the first electrode layer, and the second power line is over the second electrode layer.

7. The display device of claim 5, further comprising
a first data line connected to the first pixel circuit and at a same layer as the first power line; and
a second data line connected to the second pixel circuit and at a same layer as the second power line.

8. The display device of claim 1, further comprising:
a first pixel electrode electrically connected to the first driving transistor;

a second pixel electrode electrically connected to the second driving transistor; and
a light-shielding member at a layer between the second pixel circuit and the second pixel electrode,
wherein the first pixel circuit further comprises a first thin film transistor connected to the first driving transistor,
wherein the second pixel circuit further comprises a second thin film transistor connected to the second driving transistor, and
wherein at least a portion of the first pixel electrode overlaps at least one of a source region or a drain region of the first thin film transistor, and at least a portion of the light-shielding member overlaps at least one of a source region or a drain region of the second thin film transistor.

9. The display device of claim 8, wherein the light-shielding member extends along a periphery of the first and second pixel electrodes.

10. A display device, comprising:
a first pixel circuit comprising a first driving transistor comprising a first gate electrode and a first semiconductor layer, the first semiconductor layer comprising a first source region and a first drain region; and
a second pixel circuit comprising a second driving transistor comprising a second gate electrode and a second semiconductor layer, the second semiconductor layer comprising a second source region and a second drain region,
a first electrode layer over the first gate electrode and overlapping the first gate electrode;
a second electrode layer over the second gate electrode and overlapping the second gate electrode,
a first power line electrically connected to the first electrode layer; and
a second power line electrically connected to the second electrode layer,
wherein an area of the first electrode layer and an area of the second electrode layer are different from each other, and
wherein the first power line is over the first electrode layer and the second power line is over the second electrode layer.

11. The display device of claim 10, wherein the first electrode layer overlaps at least a portion of the first source region of the first driving transistor, and the second electrode layer overlaps at least a portion of the second source region of the second driving transistor.

12. The display device of claim 10, further comprising:
a first auxiliary electrode below the first source region of the first driving transistor and overlapping at least a portion of the first source region of the first driving transistor; and
a second auxiliary electrode below the second source region of the second driving transistor and overlapping at least a portion of the second source region of the second driving transistor.

13. The display device of claim 10, further comprising:
a first data line connected to the first pixel circuit and at a same layer as the first power line; and
a second data line connected to the second pixel circuit and at a same layer as the second power line.

14. The display device of claim 10, further comprising:
a first pixel electrode electrically connected to the first driving transistor;
a second pixel electrode electrically connected to the second driving transistor; and
a light-shielding member at a layer between the second pixel circuit and the second pixel electrode,
wherein the first pixel circuit further comprises a first thin film transistor connected to the first driving transistor,
wherein the second pixel circuit further comprises a second thin film transistor connected to the second driving transistor, and
wherein at least a portion of the first pixel electrode overlaps at least one of a source region or a drain region of the first thin film transistor, and at least a portion of the light-shielding member overlaps at least one of a source region or a drain region of the second thin film transistor.

15. The display device of claim 14, wherein the light-shielding member extends along a periphery of the first and second pixel electrodes.

16. The display device of claim 10, wherein the first electrode layer and the second electrode layer are connected to each other between the first pixel circuit and the second pixel circuit.

17. The display device of claim 10, wherein the first electrode layer and the second electrode are a single body.

18. A display device, comprising:
a first pixel circuit comprising a first driving transistor comprising a first gate electrode and a first semiconductor layer, the first semiconductor layer comprising a first source region and a first drain region; and
a second pixel circuit comprising a second driving transistor comprising a second gate electrode and a second semiconductor layer, the second semiconductor layer comprising a second source region and a second drain region,
wherein an area of the first source region of the first driving transistor and an area of the second source region of the second driving transistor are different from each other, and
wherein a width and a length of a first channel region of the first driving transistor and a width and a length of a second channel region of the second driving transistor are the same.

* * * * *